(12) United States Patent
Suto et al.

(10) Patent No.: US 7,185,304 B2
(45) Date of Patent: Feb. 27, 2007

(54) SYSTEM AND METHOD FOR VLSI CAD DESIGN

(75) Inventors: Gyorgy Suto, Hillsboro, OR (US);
Kartik Gopal, Hillsboro, OR (US);
Carl Simonsen, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 357 days.

(21) Appl. No.: 10/965,644

(22) Filed: Oct. 14, 2004

(65) Prior Publication Data
US 2006/0085780 A1    Apr. 20, 2006

(51) Int. Cl.
*G06F 17/50* (2006.01)

(52) U.S. Cl. ............................... 716/9; 716/10; 716/11; 716/12

(58) Field of Classification Search ................ 716/3–5, 716/9–12
See application file for complete search history.

(56) References Cited

U.S. PATENT DOCUMENTS

| | | | |
|---|---|---|---|
| 6,801,884 B2 | 10/2004 | Ferrari et al. | |
| 6,823,300 B1 | 11/2004 | Ferrari et al. | |
| 6,983,439 B1 * | 1/2006 | Saunders et al. | 716/9 |
| 2003/0121018 A1 * | 6/2003 | Leung et al. | 716/12 |

* cited by examiner

*Primary Examiner*—Paul Dinh
(74) *Attorney, Agent, or Firm*—Daly, Crowley, Mofford & Durkee, LLP

(57) ABSTRACT

A VLSI CAD system includes formulaic representations of grid lines to form grid boxes in a manner that enhances expressivity and reduces the amount of required processing resources.

24 Claims, 8 Drawing Sheets

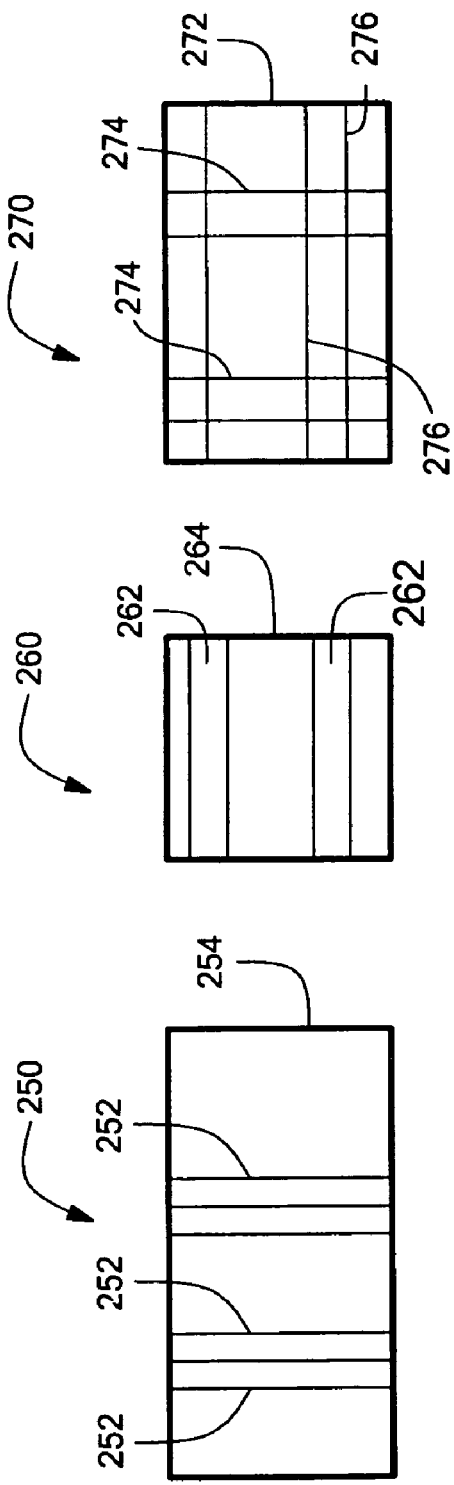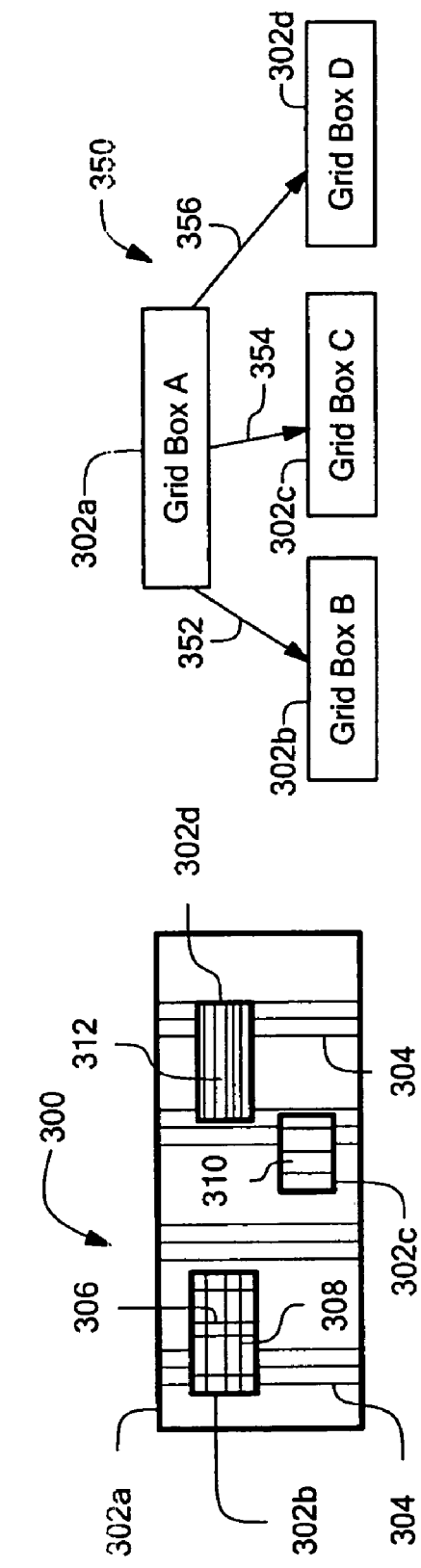

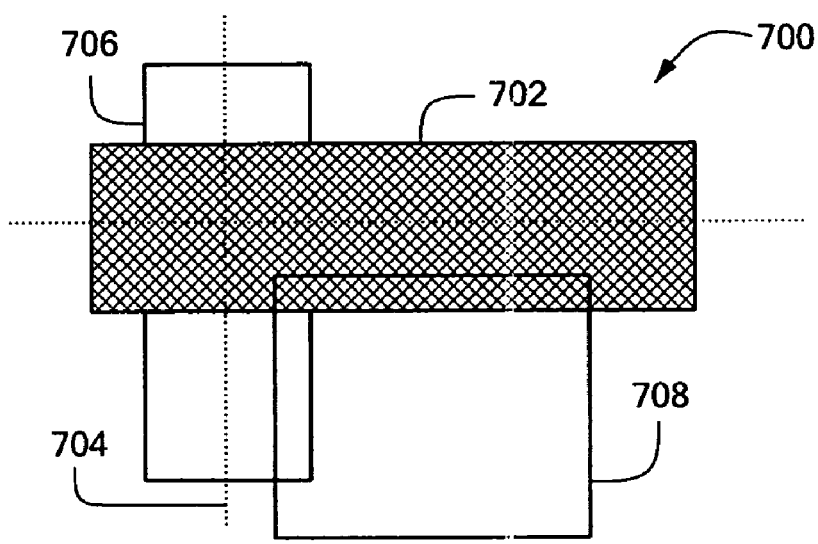
*FIG. 11A*
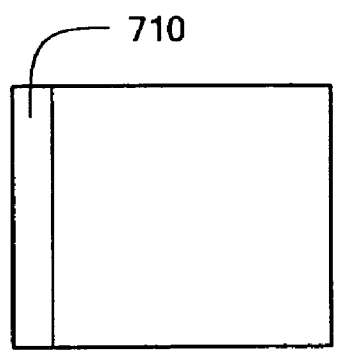   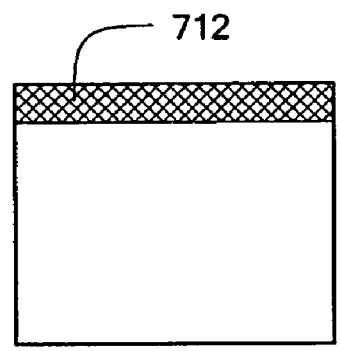
*FIG. 11B*            *FIG. 11C*
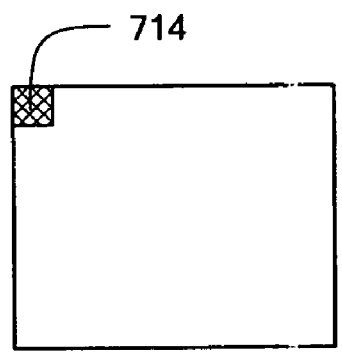
*FIG. 11D*

SYSTEM AND METHOD FOR VLSI CAD DESIGN

CROSS REFERENCE TO RELATED APPLICATIONS

Not Applicable.

STATEMENT REGARDING FEDERALLY SPONSORED RESEARCH

Not Applicable.

BACKGROUND

As is known in art, there are a variety of known Computer Aided Design (CAD) tools for designing Very Large Scale Integration (VLSI) circuits. CAD tools are used to design circuits for various applications in the electronics industry. The VLSI CAD tools are used to place various physical and circuit elements for a circuit that is ultimately fabricated from the design.

Some VLSI physical design constructs, such as power grid elements, vias between power grids on adjacent metal layers, and routing grid lines have a repetitive pattern. These repetitive patterns can be complicated by so-called EBBs (Embedded Building Blocks) and relatively sophisticated power structures. In conventional VLSI CAD tools, circuit objects are represented in data models as instantiated lines or rectangles. This type of object representation consumes a relatively large amount of memory and has a concomitant long query time. For example, a known CAD tool may store each power bar, power via and each routing grid line as a separate entity. In actual VLSI circuits designs the number of these entities can run in the tens to hundreds of millions, which can limit the size and complexity of a single unit that the CAD tool (placers, routers, design-rule checkers) can handle. Moreover, the degree of expressivity for grid structures in some known VLSI CAD tools may be somewhat limited, which makes it relatively difficult to ascertain the relationships between gridded entities. For example, for some known VLSI CAD tools it may be challenging to determine which routing grid is next to a certain power line. This complicates re-layout and process shifting and renders it more difficult to use alternative routing grids for various width combinations.

BRIEF DESCRIPTION OF THE DRAWINGS

The exemplary embodiments described herein will be more fully understood from the following detailed description taken in conjunction with the accompanying drawings, in which:

FIGS. 4A–4C are diagrams of exemplary grid boxes;

FIG. 5A is a diagram of an exemplary egrid;

FIG. 5B is a tree diagram of the egrid of FIG. 5A;

FIGS. 11A–11D are diagrams showing region query information;

DETAILED DESCRIPTION

In exemplary embodiments described herein a VLSI CAD system includes grid data structures that provide the ability to describe repetitive patterns of layout objects and/or grid lines in formulas. With this arrangement, in contrast to conventional VLSI CAD tools where memory usage is of the order $O(p+g)$ where 'p' is the number of pitches and 'g' the number of grid boxes, in the exemplary VLSI CAD tool embodiments described herein the memory usage is in the order of $O(n)$, where n is the number of objects/gridlines. In addition, the time complexity of performing a region query operation is $O(p+lg\ g)$ for known systems as compared to $O(lg\ n)$ in the exemplary system. Further, the illustrative embodiments described herein offer enhanced expressivity in comparison with conventional systems. Expressivity refers to the ease and ability of a VLSI CAD system to represent relatively complex grid structures and identify objects relative to each other. In known systems, it is quite difficult to represent complicated grid structures having a different pattern inside an existing pattern. In conventional systems, it may be cumbersome and time consuming to determine what elements are adjacent to each other. The exemplary VLSI CAD embodiments disclosed herein provide advantages over existing systems in these and other areas.

Figure 1:
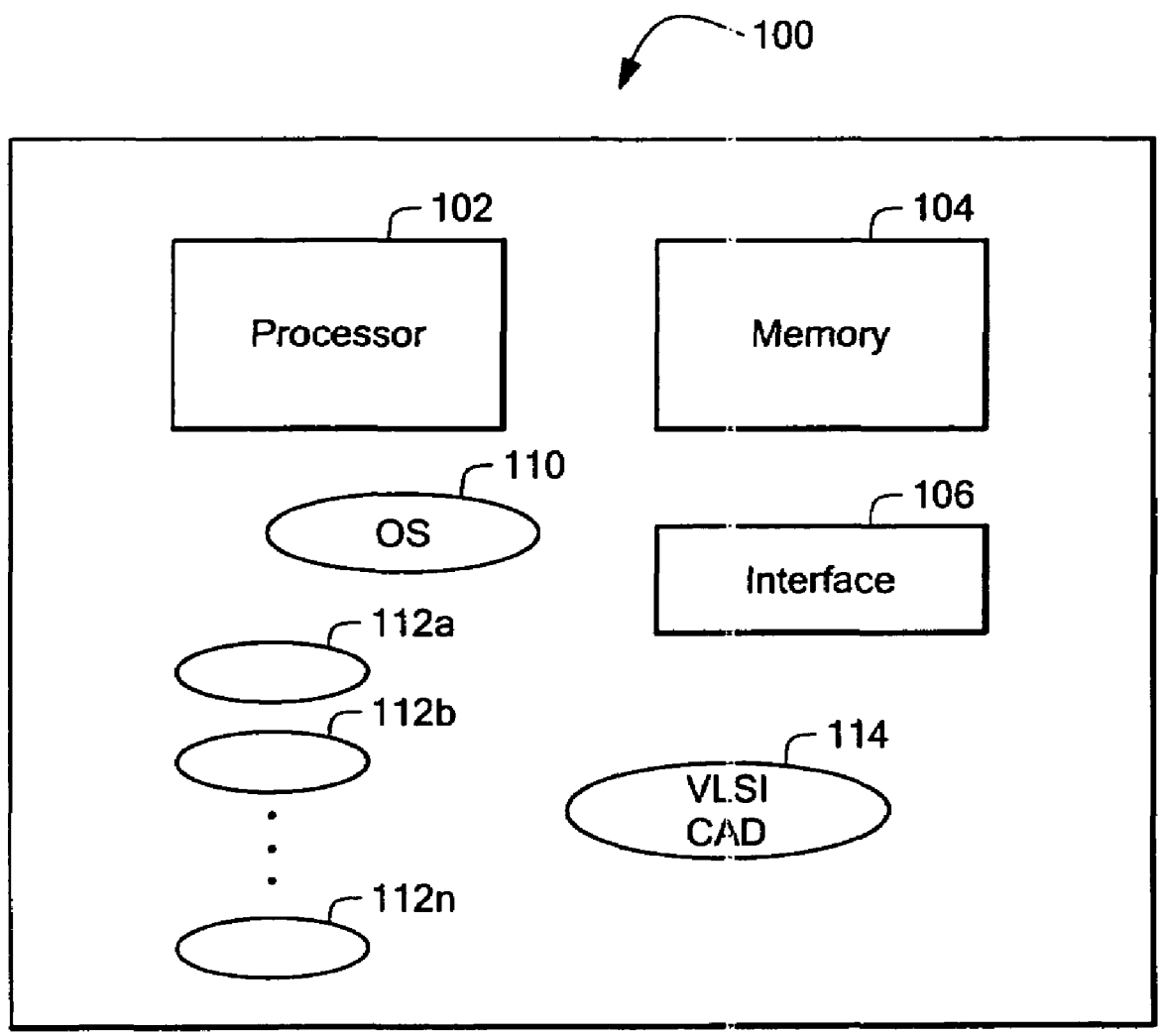
FIG. 1 is a diagram of an exemplary workstation on which a VLSI CAD system can run.

FIG. 1 shows an exemplary workstation 100 having a processor 102 coupled to a memory 104. An interface 106 enables the workstation to communicate with external devices, such as a network, in manner well known to one or ordinary skill in the art. An operating system 110, such as Windows-based, Unix-based, and/or Linux-based operating systems, work in conjunction with the processor 102 and memory 104 in a convention manner. Various application modules 112a–n, such as word processing, drawing generation, presentation development, and the like can run on the workstation. An exemplary VLSI CAD module 114 also runs on the operating system 110 in conjunction with the processor 102 and memory 104.

Figure 2:
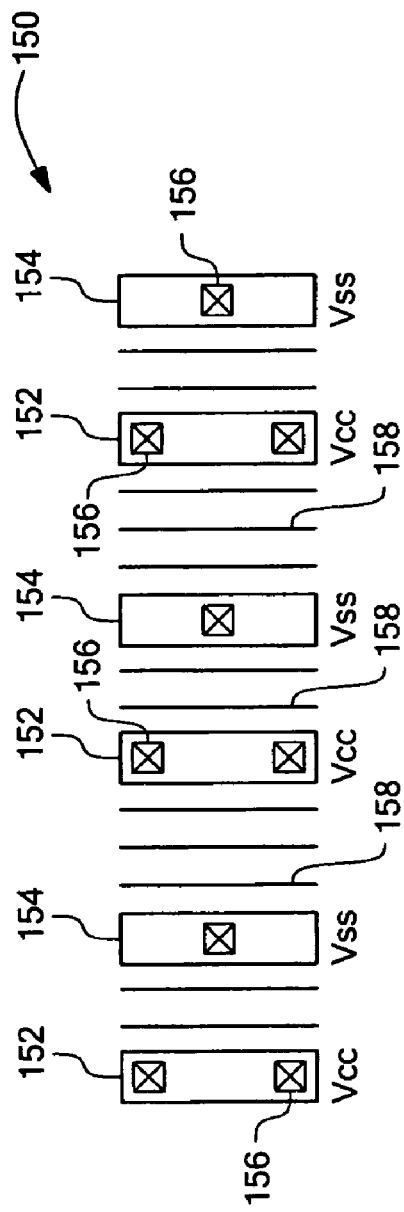
FIG. 2 is a diagram of an exemplary grid.

FIG. 2 shows an exemplary grid layout 150 that can be generated by the system 100 of FIG. 1. The grid layout 150 includes Vcc grids 152, Vss grids 154, and via cuts 156 to connect adjacent layers along with routing grid lines 158. As described in detail below, these elements are described in formulas to enhance the performance and expressivity of the VLSI CAD system. The VLSI CAD system uses various formulaic descriptors that provide the building blocks to enable a user to design a VLSI circuit.

Figure 3:
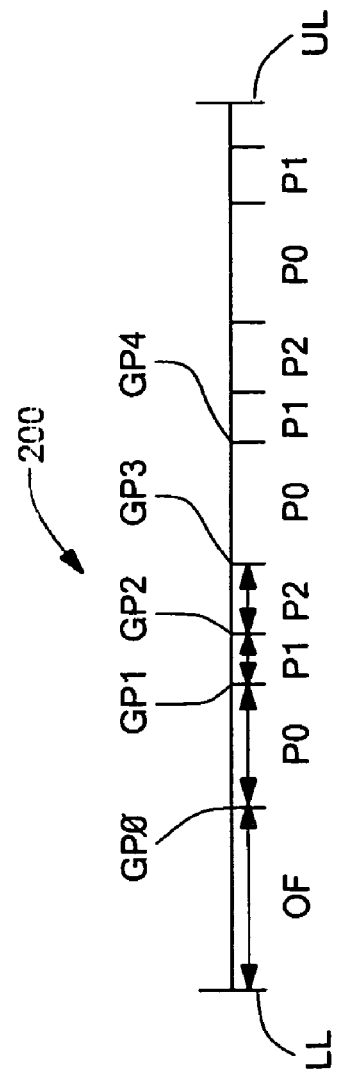
FIG. 3 is a diagram of an exemplary grid descriptor.

FIG. 3 shows an exemplary grid descriptor 200 that represents a grid pattern in a single dimension within a given range. The grid descriptor 200 includes an offset OF representing the distance of the first grid interval location GP0 from a lower limit or boundary LL followed by a repetitive pattern of grid interval locations GP1, GP2, GP3 defined by a list of pitches P0, P1, P2. The pitches P0, P1, P2 depict the distance of the grid interval locations GP0, GP1, GP2, GP3 from one another.

The first pitch P0, the second pitch P1, and the third pitch P2, which are shown in a shaded area, define the repetitive pattern of grid interval locations, e.g., P0, P1, P2, P0, P1, P2, P0, . . . , P2,. The grid interval locations are defined to be at the following locations until an upper limit or boundary UL is reached:

| | |
|---|---|
| GP0- | Lower Limit + Offset |
| GP1- | Lower Limit + Offset + P0 |
| GP2- | Lower Limit + Offset + P0 + P1 |
| GP3- | Lower Limit + Offset + P0 + P1 + P2 |
| GP4- | Lower Limit + Offset + P0 + P1 + P2 + P0 |

The location of any given grid interval location is defined by a straightforward calculation of the sum of the lower limit, the offset, and some number of the pitches P0, P1, P2.

While FIG. 3 shows a grid descriptor in a first direction, shown along an x-axis, it is understood that grid descriptors also describe grid interval locations in a second direction, e.g., the y-axis.

FIGS. 4A, 4B and 4C show respective grid boxes 250, 260, 270 that can be defined as a combination of grid descriptors and a bounding box. The grid box 250 of FIG. 4A includes a series of vertical (y-axis) grid descriptors 252 and a bounding box 254. FIG. 4B shows a similar grid box 260 having horizontal (x-axis) grid descriptors 262 and bounding box 264. FIG. 4C shows a grid box 270 having a bounding box 272 and vertical grid descriptors 274 and horizontal grid descriptors 276. It is understood that the bounding boxes 254, 264, 272 provide a visual aid for the user to perceive the grid box. An offset from boundary, as described in FIG. 3, defines the location of the bounding box.

FIG. 5A shows an exemplary egrid 300 that includes a number of grid boxes 302a–d. As used herein, an egrid refers to a data structure containing a combination of grid boxes arranged in a hierarchical manner providing a simplified and efficient representation of a complex, repetitive pattern of grid lines (horizontal/vertical/combination of both). In an exemplary embodiment, each grid box 302 can have a unique pattern of grid lines. In the illustrated embodiment, a first grid box 302a contains each of a second, third and fourth grid box 302b, 302c, 302d. The first grid box 302a includes vertical grid descriptors 304 that are "interrupted" by the nested grid boxes 302b–c.

The second grid box 302b includes vertical grid descriptors 306 and horizontal grid descriptors 308. The third grid box 302c includes vertical grid descriptors 310 and the fourth grid box 302d includes horizontal grid descriptors 312. It is understood that the grid boxes are formulae comprising grid descriptors where the grid descriptors are defined as formulas including the offset and pitches.

As shown in FIG. 5B, the grid boxes 302a–c can be represented as a tree structure 350. The tree 350 includes a first branch 352 from the first grid box 302a to the second grid box 302b, a second branch 354 from the first grid box 302a to the third grid box 302c and a third branch 356 from the first grid box 302a to the fourth grid box 302d. This tree structure corresponds to the egrid 300 structure of FIG. 5A in which the first grid box 302a contains the second, third and fourth grid boxes 302b–d.

In one embodiment, the following rules applying to the tree:

Boundaries of two grid boxes cannot intersect each other. Non-intersecting, non-overlapping grid boxes are siblings in the tree.

A grid box that is contained within another will be a child of the grid box it is contained in.

To enable efficient use of the egrid, various mechanisms are provided in the form of movement iterators. The iterators enable a user to jump to any random location on the egrid and then iterate on the grids from left to right, bottom to top (or reverse), iterate on the grid boxes of an egrid, iterate on the gridlines of a grid box (with or without taking its children grid boxes into consideration), etc. The iterators are data structures that determine the manner in which the grid lines are traversed in the egrid.

Figure 6:
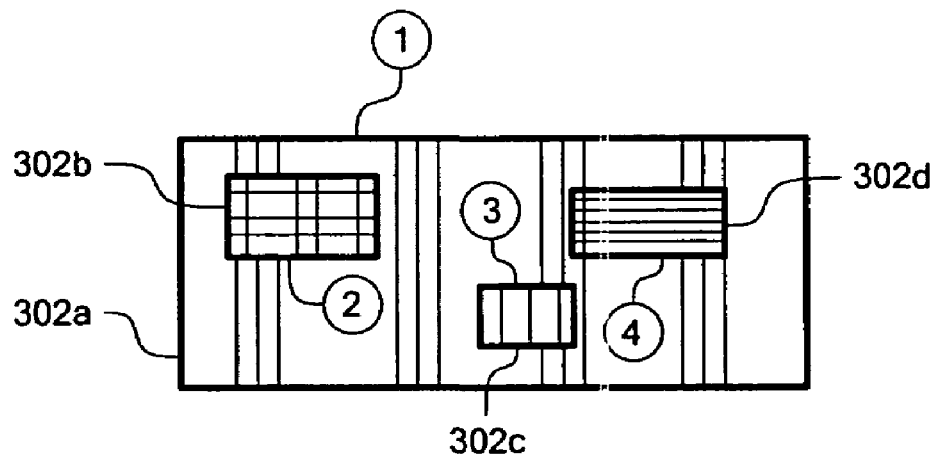
FIG. 6 is a diagram showing iterator movement in an exemplary egrid.

FIG. 6, which is similar to FIG. 4, shows the movement of a grid box iterator in an egrid 400. In one embodiment, the grid box iterator traverses the egrid tree (see FIG. 5B) in a top-down, left-right sequence. The grid box iterator moves from the first grid box 302a to the second grid box 302b, to the third grid box 302c and then to the fourth grid box 302d.

Figure 7:
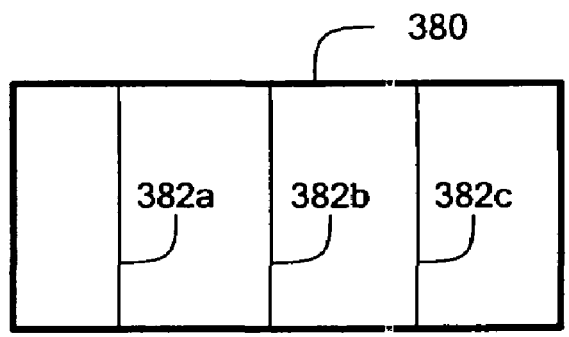
FIG. 7 is a diagram showing line iterator movement in a grid box.

FIG. 7 shows the movement of a grid line iterator on a grid box 380. This iterator traverses the lines 382a–c of the grid box 380, which can form part of an egrid. The grid line iterator moves from the first line 382a, to the second line 382b, to the third line 382c. Any nested grid boxes can be ignored.

Figure 8:
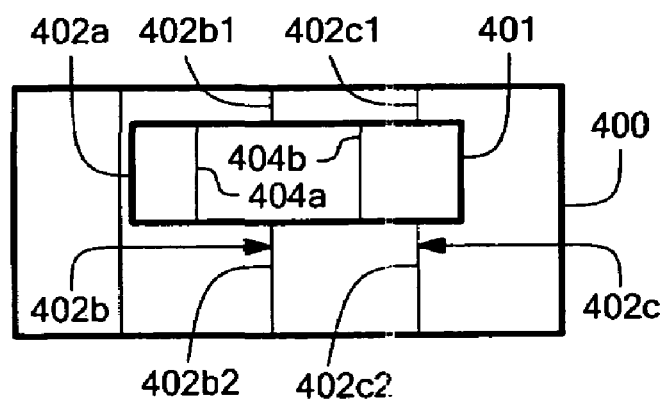
FIG. 8 is a diagram showing line iterator movement on an egrid.

FIG. 8 shows the movement of a smart grid line iterator on a grid box 400, which recognizes a nested grid box 401. The grid box 400 contains first, second and third vertical lines 402a, b, c. The second vertical grid line 402b is broken into a first portion 402b1 and a second portion 402b2 by the nested grid box 402. The third grid line 402c is broken in a similar manner into first and second portions 402c1, 402c2. The nested grid box 401 includes first and second vertical grid lines 404a,404b. The smart grid line iterator moves in sequence from 402a to 402b1 to 402b2 to 402c1 to 402c2 ignoring the nested grid box 401.

FIG. 8 also shows a grid line iterator on an egrid. This iterator hops from one line to another in the sequence 402a to 404a to 402b1 to 402b2 to 404b to 402c1 to 402c2 etc.

While the above iterators have been described moving in a particular direction, it is understood that the various iterators can move in various directions selected by a user. For example, an iterator can go in the forward as well as reverse direction and also in the horizontal as well as vertical directions.

Grid points are defined by an intersection of a horizontal and vertical grid line. Grid point iterators can be used to move from grid point to grid point.

Figure 9:
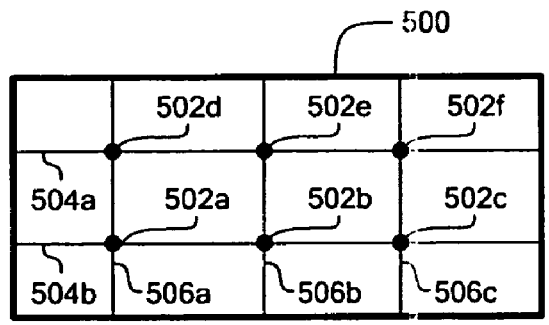
FIG. 9 is a diagram showing point iterator movement on a grid box.

FIG. 9 shows movement using a grid point iterator in a grid box 500. This iterator jumps from one grid point to another within a grid box. In one embodiment, the grid point iterator ignores any child grid box. The grid box 500 includes first and second horizontal grid lines 504a, b, and first, second and third vertical lines 506a, b, c that intersect to define six grid points 502a–f. The exemplary grid point iterator moves from grid point 502a to 502b, . . . , 502f in sequence.

Figure 9A:
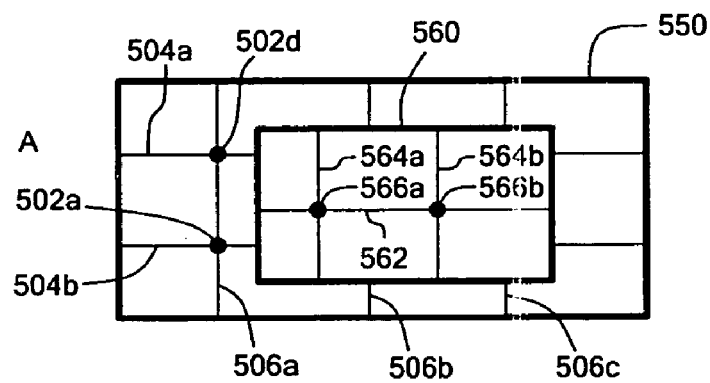
FIG. 9A is a diagram showing smart grid point iterator movement.

FIG. 9A shows an egrid 550 that is similar to the grid box 500 of FIG. 9 with the addition of a nested grid box 560 having a horizontal line 562 and first and second vertical lines 564a, b that define first and second grid points 566a, b within the nested grid box. A smart grid point iterator jumps from one grid point to another within the grid box 500 taking into account the nested or child grid box 560. More particularly, the smart grid point iterator moves from the first grid point 502a to 502d and ignores the remaining grid points 502b, c, e,f since they are covered by the child grid box 560.

Still referring to FIG. 9A, a grid point iterator on the egrid 550 iterates through the visible grid points 502a,b, 566a,b of the egrid 550. The grid points 502b, c, e, f remaining are ignored.

Figure 10:
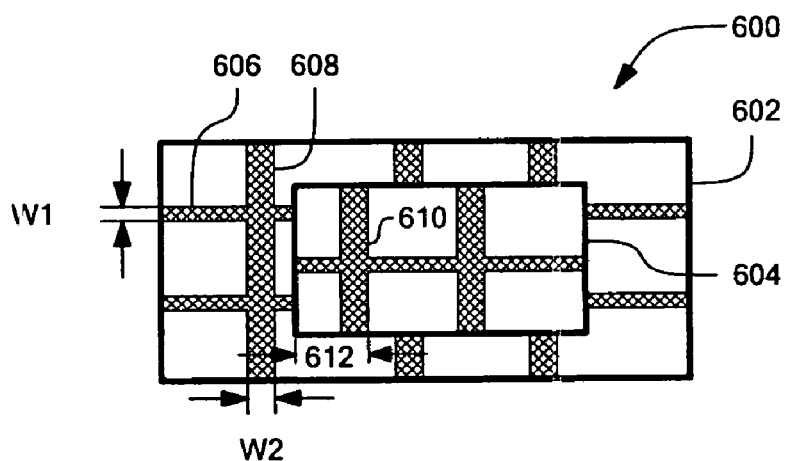
FIG. 10 is a diagram showing point iterator movement on an egrid.

Like grid line iterators, the point iterators hold the capability of going either in the forward or reverse direction As shown in FIG. 10, the grid lines can have two dimensions to provide ribbons of selected widths to grid lines for modeling the layout. The egrid 600 includes a parent grid box 602 and a child grid box 604. The parent grid box 602 includes a first horizontal grid line 606 having a specified width W1 and a first vertical grid line 608 having a width W2. The child grid box 604 includes a vertical grid line 610 having a width 612 selected by the user. Each grid line has a width assigned by the user or is assigned by default. In one embodiment, the default width for grid lines is zero.

In an exemplary embodiment, an application programming interface (API) enables a user to attach objects to each line of the egrid. Before attaching the object, the user defines the object. For example, assume a user wants to attach a ribbon, which can be considered a rectangular block, to each line of the grid. The user specifies dimensions for the ribbon. A module of the API can be called, e.g., ApplyRibbon, that applies the ribbon to each of the lines.

When the user specifies the ribbon, a rectangle is defined. Inside the egrid there are two parameters to represent the height and width of the ribbon that the user specified. The egrid lines are still lines and not ribbons and it is at runtime that the width and height of the ribbon is attached. The ribbon is stored to provide answers/outputs to users based on ribbons and not lines.

A region query in a grid box recalculates the offset and rotates the pitch list appropriately and returns a new grid box. At the egrid level, a new egrid is formed from the result of the region query and returned to the user. The user can then utilize iterators to move within the newly formed egrid. When a region query is performed on an egrid to which ribbons are applied, the query catches only portion of the object lying within the queried region, as described below.

FIG. 11A shows a portion of an egrid having a horizontal grid line 700 having a first ribbon 702 and a vertical grid line 704 having a second ribbon 706. A query box 708 can be generated by a user that overlaps a certain portion of the egrid.

As shown in FIG. 11B a vertical iterator returns a portion 710 of the second ribbon 706 defined by an overlap of the query box 708 and the second ribbon 706. FIG. 11C shows a horizontal iterator that returns a portion 712 defined by an overlap of the query box 708 and the first ribbon 702. FIG. 11D shows a point iterator that returns a portion 714 defined by an overlap of the query box 708 and the first and second ribbons 702, 706.

Figure 12B:
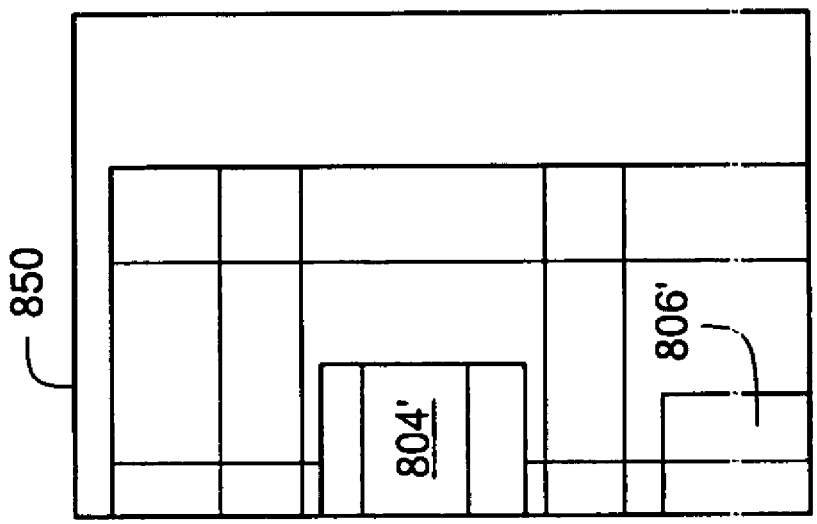
FIG. 12B is a diagram showing a new egrid as a result of the region query of FIG. 12A.
Figure 12A:
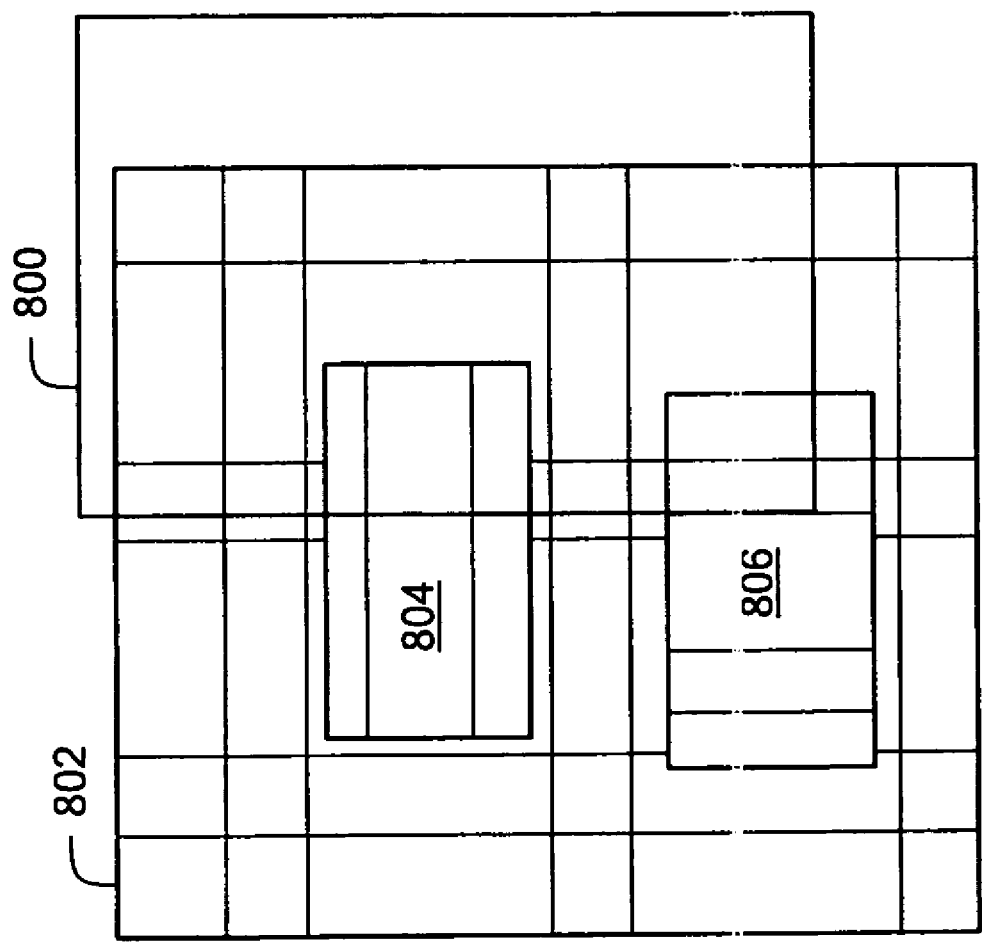
FIG. 12A is a diagram showing a region query on an egrid.

FIG. 12A shows a further region query 800 on an egrid 802 having first and second of grid boxes 804, 806. FIG. 12B shows a new egrid 850 that contains lines that fell within the region query 800 of FIG. 12A. As can be seen, only portions 804', 806' of the first and second grid boxes are contained in the resultant egrid 850 of FIG. 12B.

The system also enables users to jump to any arbitrary location in an egrid in horizontal and vertical orientations. The system also enables a user to jump to a particular track number directly without iterating through all the grid lines in the grid box as well as the egrid. Jump functions return iterators with which the user can either go forward or backward. Tracks are reference lines in the layout that aid the designer in performing various tasks, such as placement, routing, etc.

Figure 13:
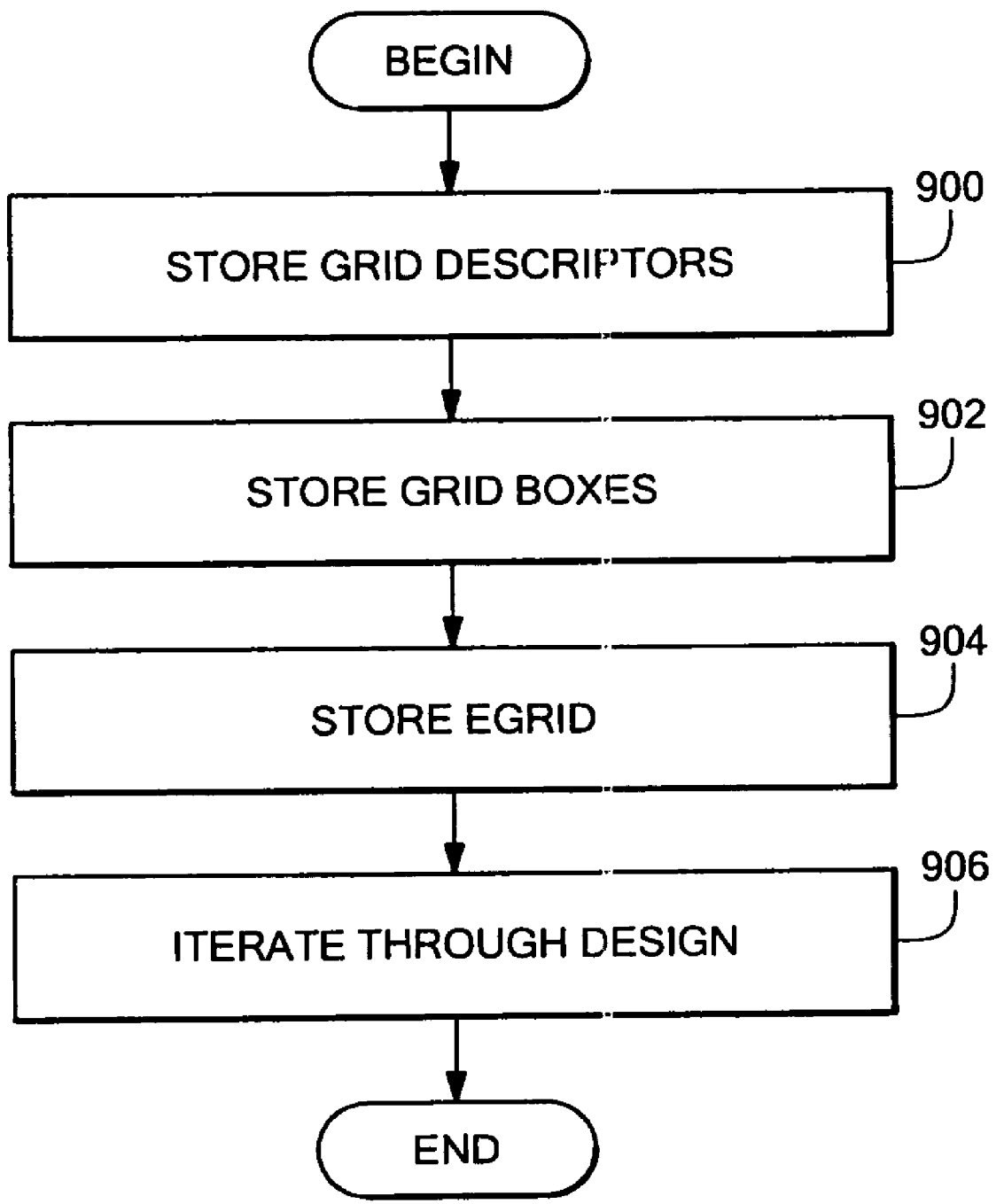
FIG. 13 is a flow diagram showing an exemplary processing sequence to provide a VLSI CAD design.

FIG. 13 shows an exemplary sequence of processing blocks to implement a VLSI CAD design in accordance with an exemplary embodiment. In processing block 900, a series of grid descriptors are stored having an offset from some boundary and a series of pitches that define a repetitive pattern. In one embodiment, the grid descriptors extend in either the vertical or horizontal direction. In other embodiments, the grid descriptors can extend in further directions.

In processing block 902, a plurality of grid boxes are stored each defined by a set of grid descriptors. The grid boxes can include a bounding box to visually define the box for a user. In addition, the grid boxes can be stored in a tree structure. An egrid defined from a set of grid boxes is stored in processing block 904. It is understood that the various design components, e.g., grid descriptors, grid boxes, and egrids, are defined by the user to implement various structures, such as power grids, vias, routing grid lines.

In processing block 906, various iterators can be used to move within the design in accordance with the user's instructions. For example, grid line iterators move from grid line to grid line, grid point iterators move from grid point to grid point, and grid box iterators moves from grid box to grid box.

The exemplary VLSI CAD system embodiments described herein provide significant memory use reduction and run-time performance over know instantiation-based systems. The exemplary VLSI CAD system embodiments also provides an enhance level of expression due to the mathematical representation of the design elements. Relationships between various egrids, as well as global modifications, such as re-planning, shrinking, etc., is significantly more simple than in the previous, instance-based representation systems.

Other embodiments are within the scope of the following claims.

What is claimed is:

1. A method of generating a VLSI CAD design, comprising:
    storing a plurality of horizontal and vertical grid descriptors each having an offset and at least one pitch;
    storing a plurality of grid boxes each defined from a set of grid descriptors from the plurality of grid descriptors, wherein the set of grid descriptors includes horizontal and vertical grid descriptors; and
    storing an egrid defined from a set of grid boxes from the plurality of grid boxes.

2. The method according to claim 1, further including generating a bounding box for a first one of the grid boxes.

3. The method according to claim 1, further including representing the plurality of grid boxes in a tree structure.

4. The method according to claim 1, wherein certain ones of the plurality of grid boxes overlap.

5. The method according to claim 1, further including providing an iterator to move within the design based upon user instructions.

6. The method according to claim 1, further including providing a grid box iterator to move from grid box to grid box.

7. The method according to claim 1, further including providing a grid line iterator to move from grid line to grid line.

8. The method according to claim 7, wherein the grid line iterator can move within nested grid boxes.

9. The method according to claim 1, further including providing a grid point iterator to move from grid point to grid point.

10. The method according to claim 1, further including storing a ribbon associated with a first one of the grid lines.

11. The method according to claim 10, wherein the ribbon has a rectangular shape with user-defined dimensions.

12. The method according to claim 1, further including generating a further grid box from a region query.

13. A VLSI CAD system, comprising:
a processor; and
a memory to store a plurality of horizontal and vertical grid descriptors each having an offset and at least one pitch, a plurality of grid boxes each defined from a set of grid descriptors from the plurality of grid descriptors, and an egrid defined from a set of grid boxes from the plurality of grid boxes.

14. The system according to claim 13, wherein the plurality of grid boxes are represented in a tree structure.

15. The system according to claim 14, further including a mechanism to iterate within the design based upon user instructions.

16. The system according to claim 15, wherein the mechanism further includes a grid box iterator to move from grid box to grid box.

17. The system according to claim 15, wherein the mechanism further includes a grid line iterator to move from grid line to grid line.

18. The system according to claim 13, wherein the memory stores a ribbon associated with a first one of the grid lines.

19. An article comprising:
a storage medium having stored thereon instructions that when executed by a machine result in the following:
storing a plurality of horizontal and vertical grid descriptors each having an offset and at least one pitch;
storing a plurality of grid boxes each defined from a set of grid descriptors from the plurality of grid descriptors, wherein the set of grid descriptors includes horizontal and vertical grid descriptors; and
storing an egrid defined from a set of grid boxes from the plurality of grid boxes.

20. The article according to claim 19, further including instructions to generate a bounding box for a first one of the grid boxes.

21. The article according to claim 19, further including instructions to represent the plurality of grid boxes in a tree structure.

22. The article according to claim 19, further including instructions to provide an iterator to move within the design based upon user instructions.

23. The article according to claim 19, further including instructions to provide a grid box iterator to move from grid box to grid box.

24. The article according to claim 19, further including instructions to generate a further grid box from a region query.

* * * * *

UNITED STATES PATENT AND TRADEMARK OFFICE
CERTIFICATE OF CORRECTION

| | | |
|---|---|---|
| PATENT NO. | : 7,185,304 B2 | Page 1 of 1 |
| APPLICATION NO. | : 10/965644 | |
| DATED | : February 27, 2007 | |
| INVENTOR(S) | : Suto et al. | |

It is certified that error appears in the above-identified patent and that said Letters Patent is hereby corrected as shown below:

On the title page item (75), in "Inventors", in column 1, line 2, delete "Hillsboro," and insert -- Tigard, --, therefor.

Signed and Sealed this

Eleventh Day of December, 2007

JON W. DUDAS
*Director of the United States Patent and Trademark Office*